(12) United States Patent
Nishiura

(10) Patent No.: US 6,845,897 B2
(45) Date of Patent: Jan. 25, 2005

(54) ULTRASONIC HORN FOR A BONDING APPARATUS

(75) Inventor: Shinichi Nishiura, Fussa (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 10/290,818

(22) Filed: Nov. 8, 2002

(65) Prior Publication Data

US 2003/0090003 A1 May 15, 2003

(30) Foreign Application Priority Data

Nov. 12, 2001 (JP) ........................................ 2001-345765

(51) Int. Cl.$^7$ ................................................ B23K 1/06
(52) U.S. Cl. .......................................... 228/1.1; 228/4.5
(58) Field of Search ............................. 228/1.1, 110.1, 228/4.5, 180.5, 245, 246, 248.1, 256, 261, 193, 194, 234.1; 156/73.1, 580.1, 580.2, 73.3; 219/603, 607, 59.1, 61

(56) References Cited

U.S. PATENT DOCUMENTS

| | | | | | |
|---|---|---|---|---|---|
| 4,131,505 A | * | 12/1978 | Davis, Jr. | ................ | 156/580.1 |
| 4,499,845 A | * | 2/1985 | Pope | ...................... | 116/137 A |
| 5,431,324 A | * | 7/1995 | Kajiwara et al. | ........... | 228/102 |
| 6,135,338 A | * | 10/2000 | Kyomasu et al. | ............ | 228/1.1 |
| 6,247,628 B1 | * | 6/2001 | Sato et al. | .................... | 228/1.1 |
| 6,321,969 B1 | * | 11/2001 | Miller | ........................ | 228/4.5 |
| 6,523,732 B1 | * | 2/2003 | Popoola et al. | .............. | 228/1.1 |
| 6,575,348 B2 | * | 6/2003 | Kimura et al. | ............... | 228/1.1 |
| 6,578,753 B1 | * | 6/2003 | Sakakura | .................. | 228/110.1 |
| 2002/0185518 A1 | * | 12/2002 | Kimura et al. | ............... | 228/1.1 |
| 2003/0066863 A1 | * | 4/2003 | Skogsmo et al. | ........ | 228/111.5 |
| 2003/0090003 A1 | * | 5/2003 | Nishiura | ..................... | 257/784 |
| 2003/0106923 A1 | * | 6/2003 | Kimura et al. | ............... | 228/1.1 |

FOREIGN PATENT DOCUMENTS

| | | | |
|---|---|---|---|
| JP | 407060190 A | * | 3/1995 |
| JP | 8-241908 | | 9/1996 |
| JP | 10303240 A | * | 11/1998 |
| JP | 3128715 | | 11/2000 |

OTHER PUBLICATIONS

Translation of JP–407060190A.*
Translation of JP–10303240A.*
Translation of JP–06196533.*

* cited by examiner

Primary Examiner—Kiley S. Stoner
(74) Attorney, Agent, or Firm—Koda & Androlia

(57) ABSTRACT

An ultrasonic horn used in a wire bonding apparatus and includes a horn main body that has a capillary, which is at one end of the horn main body and through which a wire is passed, and a vibrator, which is at another end of the horn main body; and the horn main body being formed with at least two grooves that extends along the central axis of the horn main body. The cross-sectional shape of the portion of the horn main body where the grooves are formed is, for instance, left-right symmetry, top-bottom symmetry, or left-right and top-bottom symmetry; and the cross section of the portion of the horn main body where the grooves are formed, for instance, a cruciform shape, X shape, Y shape or H shape.

4 Claims, 5 Drawing Sheets

US 6,845,897 B2

ULTRASONIC HORN FOR A BONDING APPARATUS

BACKGROUND OF THE INVENTION

1. Field of the Invention

The present invention relates to a wire bonding apparatus and more particularly to an ultrasonic horn for a bonding apparatus.

2. Prior Art

As seen from FIGS. 7A and 7B, a typical ultrasonic horn which is referred to by the reference numeral 1 and used in a wire bonding apparatus is comprised of a horn main body 3 and a vibrator 4. The horn main body 3 has at one end thereof a capillary 2 through which a wire (not shown) is passed, and the vibrator 4 is screw-connected to another end of the horn main body 3.

The horn main body 3 is formed at its rear end with a flange portion 5 that is fastened to a bonding arm (not shown) of a bonding apparatus.

The vibrator 4 includes a vibration generating source attachment shaft 6, an insulating pipe 7, a vibration generating source 8 and a nut 9. The vibration generating source attachment shaft 6 is screw-connected to the rear end of the horn main body 3. The insulating pipe 7 is fitted over the vibration generating source attachment shaft 6. The vibration generating source 8 is structured by a plurality of doughnut-form electrostriction elements or magnetostriction elements that are fitted over the insulating pipe 7 in a stacked configuration. The nut 9 is screw-connected to the vibration generating source attachment shaft 6 so that the vibration generating source 8 is tightened in place by the nut 9.

A wire bonding apparatus equipped with the above-described ultrasonic horn is described in, for instance, Japanese Patent No. 3128715 (Laid-Open No. H6-196533).

In the above-described ultrasonic horn 1, the vibration of the vibration generating source 8 is transmitted to the entire ultrasonic horn 1 and creates a standing-wave vibration in the ultrasonic horn 1, thus supplying the necessary energy to the capillary 2. In an unloaded state (in which wire bonding is not being performed), the energy accumulates in a stable fashion; and since the ultrasonic horn 1 is designed a precisely and has dimensions in which a node of vibration is at its flange portion 5, there is little vibration in the flange portion and therefore loss of movement of the ultrasonic horn 1 is small even when the ultrasonic horn 1 is attached to the bonding arm (not shown). In the unloaded state, the ultrasonic horn 1 acts in the manner of a tuning fork. The vibration generating source 8 is ordinarily driven by constant-current driving, etc., so that the amplitude has a specified value. When energy is used for wire bonding via the capillary 2, current is applied so that the energy necessary for equilibrium is sent into the vibration generating source 8. In this way, wire bonding that uses ultrasonic waves is performed.

Generally, ultrasonic horns are formed from an iron or steel material. Accordingly, the inertial moment is large; and when the bonding operation is performed at a high speed, the impact load, which is applied when a capillary on the horn contacts the members that are being bonded, such as pellets or leads, increases, resulting in a possibility that the members being bonded are damaged by the capillary.

Japanese Patent Application Laid-Open (Kokai) No. 8-241908, for instance, discloses a conventional wire bonding apparatus that reduces the inertial moment and alleviates the impact load on the members being bonded. In this wire bonding apparatus, the inertial moment is reduced by way of shortening the inter-axial distance between the axial center of the rotating shaft of the ultrasonic horn and the central axis of the ultrasonic horn in the direction of length. In addition, the supporting members that support the ultrasonic horn are formed from a light metal material; as a result, driving of the ultrasonic horn is accomplished by a motor that has a small output as the driving source for the rotating shaft. However, even with such a means as employed in this prior art, there is a limit to the alleviation of the inertial moment and impact load.

SUMMARY OF THE INVENTION

Accordingly, the object of the present invention is to provide a wire bonding apparatus that reduces the inertial moment and impact load, so that a great improvement is achieved in terms of increase of the speed of bonding operation and facilitating vertical driving of the ultrasonic horn. The characteristics of the means that achieve the above-described object bring, by way of lightening the load, stable and desirable results in fine pitch bonding in which small balls are formed.

More specifically, the above object is accomplished by a unique structure of the present invention for an ultrasonic horn that is used in a wire bonding apparatus and is comprised of a horn main body that has a capillary, which is at one end of the horn main body and through which a bonding wire is passed, and a vibrator, which is provided on the horn main body; and in the present invention, the horn main body is formed with at least two grooves that extend along the central axis of the horn main body.

In this unique structure, the cross-sectional shape of the portion of the horn main body in which the two grooves are formed is left-right symmetry, top-bottom symmetry, or left-right and top-bottom symmetry.

Also, the cross section of the portion of the horn main body in which the grooves are formed is a cruciform shape, X shape, Y shape or H shape.

In addition, in the present invention, the grooves are disposed so that they extend from a point that corresponds to one vibration node of the horn main body to another point that corresponds to another vibration node of the horn main body.

DETAILED DESCRIPTION OF THE INVENTION

Figure 7A:
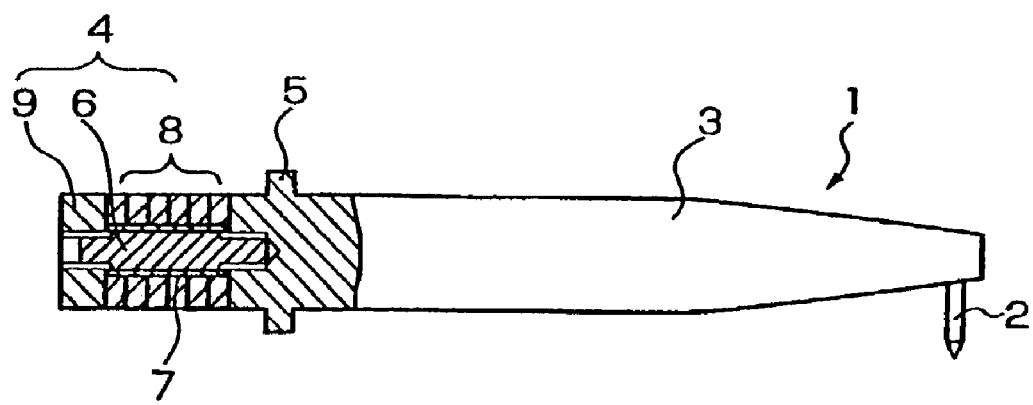
FIG. 7A shows, partially in cross section, one example of conventional ultrasonic horn
Figure 7B:
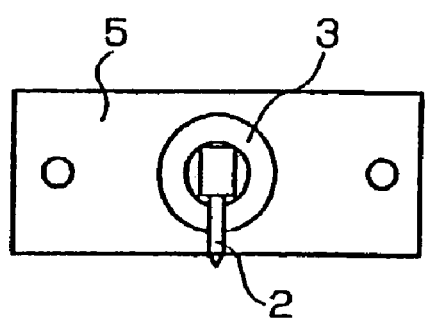
FIG. 7B is a front view thereof.

The first embodiment of the present invention will be described below with reference to FIG. 1. Elements that are the same as those in FIGS. 7A and 7B or that correspond to those in FIGS. 7A and 7B are labeled with the same reference numeral as those in FIGS. 7A and 7B, and a description of such elements are omitted.

In the horn main body 3, the portion between the flange portion 5 and the vicinity where the capillary 2 is attached to the horn main body 3 (the area defined by dash-dotted lines in FIGS. 1A and 1B) is formed in a cruciform cross-sectional shape. More specifically, the horn main body 3 is, as seen from FIG. 1D, left-right symmetry about the axial center 10, and grooves 15, 16, 17 and 18 are formed along the axial center 10 so that the horn main body 3 has vertical (or upper and lower) projecting sections 11 and 12 that project above and below the horn main body 3 and horizontal (or left and right) projecting sections 13 and 14 that project to the left and right from the axial center 10. The grooves 15, 16, 17 and 18 are formed so that these grooves extend from the vibration node 20 located on the capillary 2 side of the horn main body 3 to the vibration node 21 located in the flange portion 5.

As a result of the grooves 15, 16, 17 and 18 formed in the horn main body 3, the weight of the horn main body 3 is reduced. As a result, the inertial moment is conspicuously low, a great reduction in the impact load is achieved, and the speed of bonding operation is increased. Furthermore, since the ultrasonic horn 1 has a weight which is less than a horn main body that has no grooves, the torque of the motor that drives the ultrasonic horn 1 upward and downward is reduced, the ultrasonic horn 1 has an improved stability of the operation in the vertical direction, and the bondability is stabilized. Furthermore, the rigidity of the ultrasonic horn 1 is ensured by the horizontal projecting sections 13 and 14, and any impact that is applied to the horn main body 3 is sufficiently withstood as a result of the vertical projecting sections 11 and 12. In other words, the weight of the ultrasonic horn 1 is greatly reduced while the rigidity of the ultrasonic horn 1 is maintained. Furthermore, with the grooves 15, 16, 17 and 18 that are formed from the vibration node 20 which is on the capillary 2 side, the position of the vibration node 20 during the transmission of ultrasonic vibrations is stabilized, and the bondability is also stabilized.

FIGS. 2A through 2D show the second embodiment of the present invention. Elements that are the same as those in the first embodiment and the elements that correspond to those in the first embodiment are labeled with the same reference numerals as those in the first embodiment, and a description of these elements is omitted.

In the first embodiment, the grooves 15, 16, 17 and 18 are formed more or less throughout the entire horn main body 3, i.e., from the vibration node 20 which is on the capillary 2 side to the vibration node 21 which is on the flange portion 5 side. In the second embodiment of FIGS. 2A through 2D, the grooves are formed from the vibration node 20 which is on the capillary 2 side to the vibration node 22 which is located at an intermediate point between the vibration node 20 and the vibration node 21. An effect similar to that of the first embodiment can be obtained in the structure in which the grooves are formed in this way as shown in FIGS. 2A through 2D. Furthermore, as a result of the grooves 15, 16, 17 and 18 formed from the vibration node 20 on the capillary 2 side to the vibration node 22 at an intermediate point, the position of the vibration node 20 during the transmission of the ultrasonic vibrations is stabilized, and the bondability is thus stabilized.

FIGS. 3A through 3D show the third embodiment of the present invention which is the modification of the above-described embodiments.

Figure 3A:
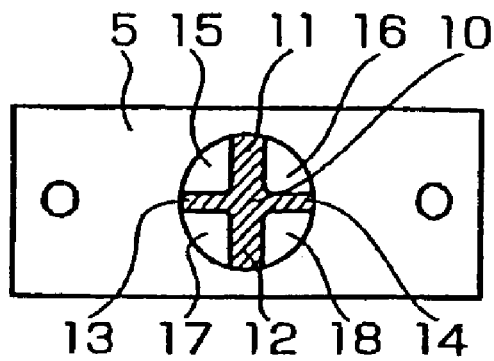
FIGS. 3A, 3B, 3C and 3D show, in cross section, the different shapes of the ultrasonic horn according to the third embodiment of the present invention; each one of FIGS. 3A, 3B, 3C and 3D corresponding to the cross section of FIG. 1D or 2D.
Figure 3B:
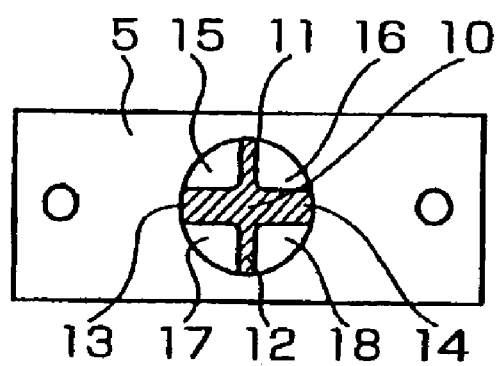
Figure 3C:
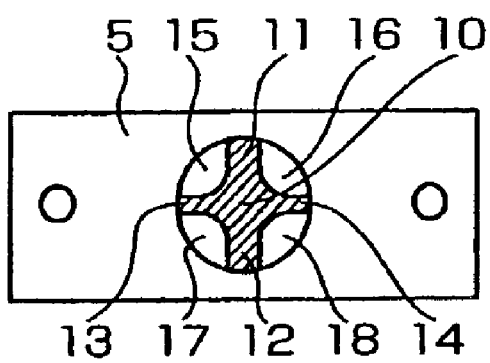
Figure 3D:
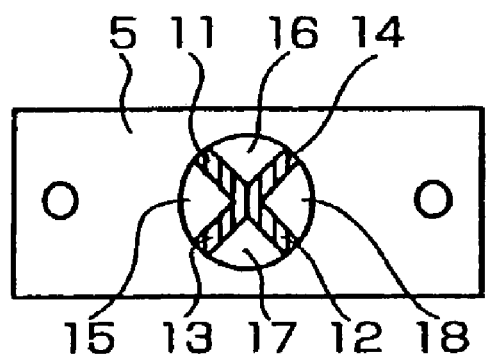

In the horn main body of FIG. 3A, the vertical (or upper and lower) projecting sections 11 and 12 are wider than the horizontal (left and right) projecting sections 13 and 14. In the horn main body of FIG. 3B, the horizontal (left and right) projecting sections 13 and 14 are wider than the vertical (upper and lower) projecting sections 11 and 12. In the horn main body of FIG. 3C, the grooves 15, 16, 17 and 18 have a circular arc shape. In the horn main body of FIG. 3D, the grooves 15, 16, 17 and 18 are formed in an above and below and on the left and right fashion, so that the projecting sections 11, 12, 13 and 14 have an X shape.

Figure 1A:
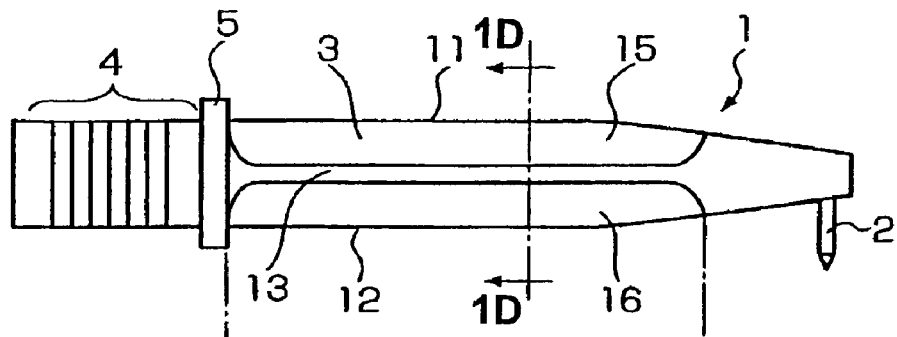
FIG. 1A is a side view of the ultrasonic horn for a wire bonding apparatus according to the first embodiment of the present invention.
Figure 1B:
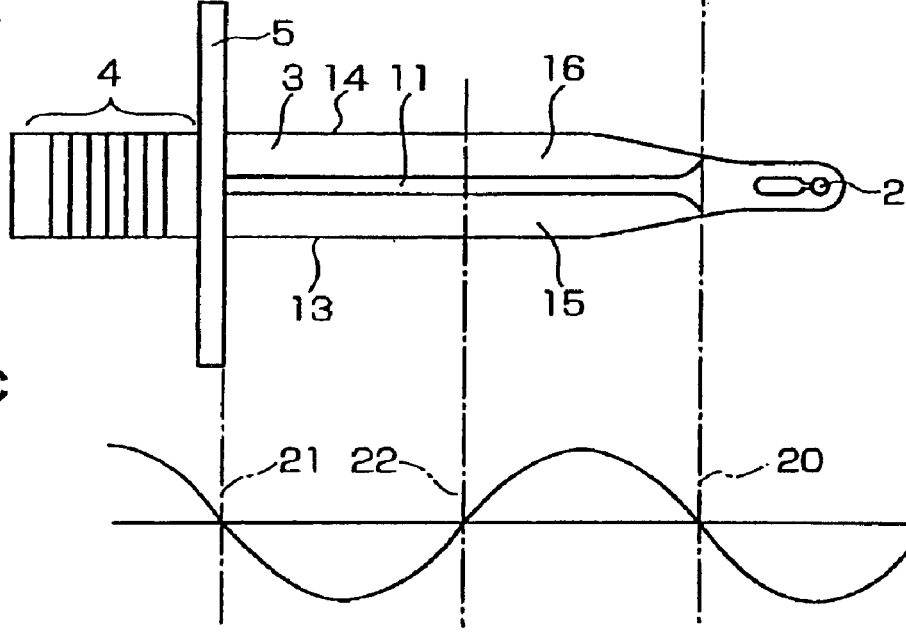
FIG. 1B is a top view thereof.
Figure 1C:
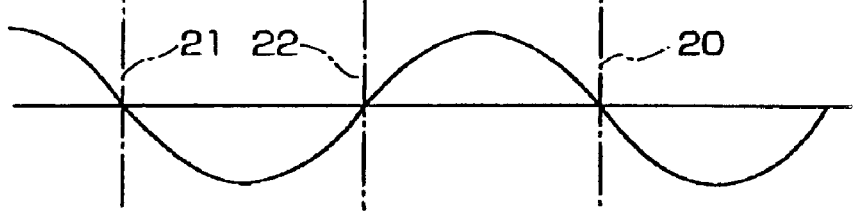
FIG. 1C is a diagram showing the vibration nodes of the horn.
Figure 1D:
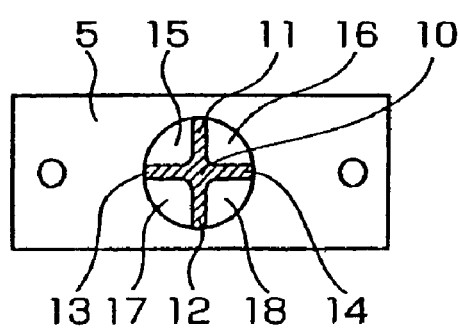
FIG. 1D is a sectional view taken along the line 1D—1D in FIG. 1A.
Figure 2A:
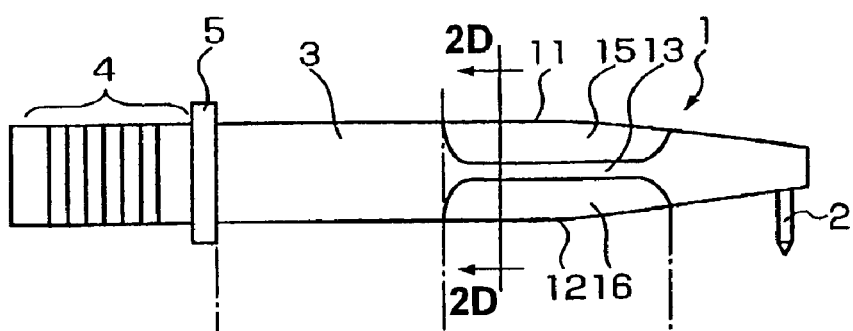
FIG. 2A is a side view of the ultrasonic horn for a wire bonding apparatus according to the second embodiment of the present invention.
Figure 2B:
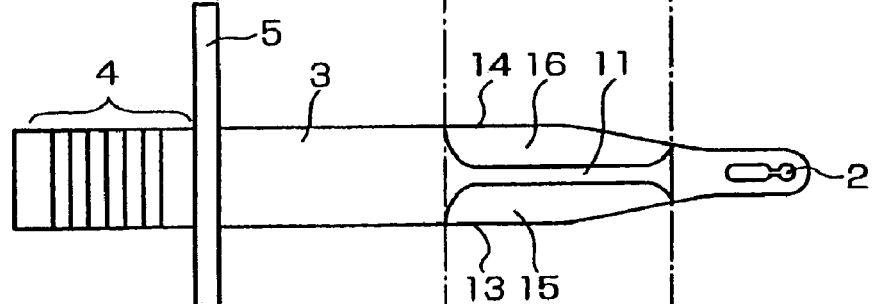
FIG. 2B is a top view thereof.
Figure 2C:
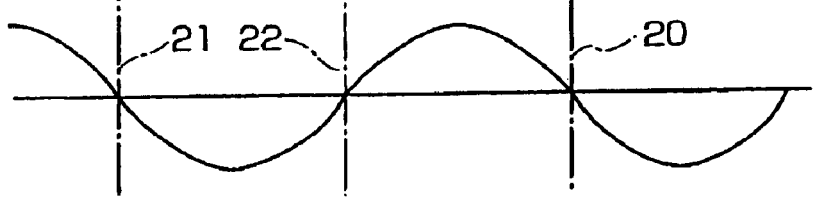
FIG. 2C is a diagram showing the vibration nodes of the horn.
Figure 2D:
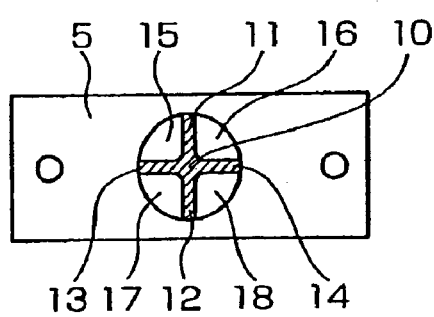
FIG. 2D is a sectional view taken along the line 2D—2D in FIG. 2A.

As in the first embodiments and as seen from FIG. 1C, the grooves 15, 16, 17 and 18 in the third embodiment are formed so as to extend from the vibration node 20 located on the capillary 2 side of the horn main body 3 to the vibration node 21 located on the flange portion 5 side. Also, as in the second embodiment and as seen from FIG. 2C, these grooves 15, 16, 17 and 18 can be formed from the vibration node 20 which is on the capillary 2 side to the vibration node 22 which is located at an intermediate point between the vibration node 20 and the vibration node 21.

The same effect as those of the above-described embodiments can be obtained in the case of such a cruciform modified shape or X shape shown in FIGS. 3A through 3D.

FIGS. 4A and 4B, 5A and 4B, and 6A and 6B show, respectively, the fourth, fifth and sixth embodiments of the present invention. In these embodiments, the number of grooves differs from each other and from the above embodiments.

In the respective embodiments described above, the horn main body 3 has four projecting sections 11, 12 and 13, 14 and four grooves 15, 16, 17 and 18; and it is, in cross section, in a cruciform shape or a shape close to a cruciform shape. In the fourth embodiment shown in FIGS. 4A and 4B, two grooves 30 and 31 and 32 or 33 are formed. In the fifth embodiment shown in FIGS. 5A and 5B, three grooves 50, 51 and 52 or 53, 54 and 55 are formed. In the sixth embodiment shown in FIGS. 6A and 6B, as an example of horn main body that has five or more grooves, eight grooves 70 through 77 or 80 through 87 are formed in the horn main body.

Figure 4A:
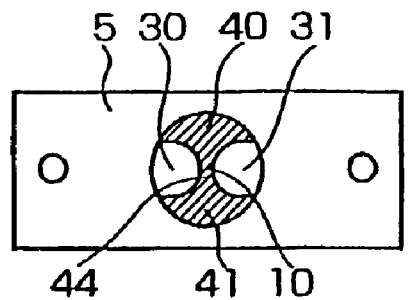
FIGS. 4A and 4B show, in cross section, the different shapes of the ultrasonic horn according to the fourth embodiment of the present invention; each one of FIGS. 4A and 4B corresponding to the cross section of FIG. 1D or 2D.
Figure 4B:
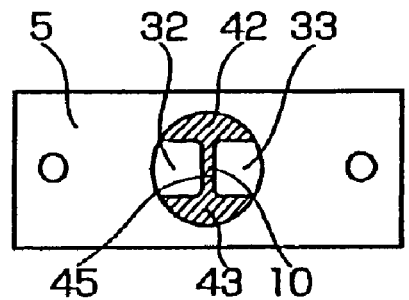

More specifically, in the fourth embodiment shown in FIGS. 4A and 4B, circular-arc-form grooves 30 and 31 or square grooves 32 and 33 are formed in the left and right sides of the horn main body, so that projecting sections 40 and 41 or 42 and 43 are disposed above and below. Accordingly, in this embodiment as well, the horn main body shows left-right symmetry. In this embodiment, as in the above-described embodiments, the weight of the horn main body is reduced by means of the grooves 30 and 31 or 32 and 33. Furthermore, rigidity and durability are maintained by the vertical sections 44 or 45 that extend in the vertical direction from the axial center 10 and by the upper and lower projecting sections 40 and 41 or 42 and 43, so that an effect similar to that of the above-described embodiments is obtained.

Figure 5A:
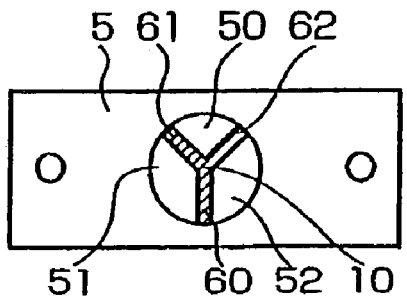
FIGS. 5A and 5B show, in cross section, the different shapes of the ultrasonic horn according to the fifth embodiment of the present invention; each one of FIGS. 5A and 5B corresponding to the cross section of FIG. 1D or 2D.
Figure 5B:
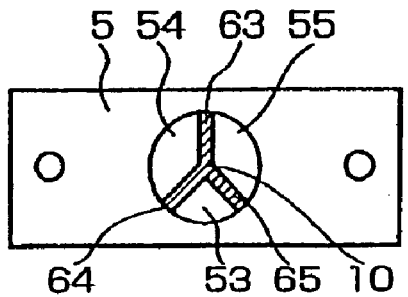

In the fifth embodiment shown in FIGS. 5A and 5B, the horn main body has three projecting sections 60, 61 and 62 forming a Y shape or has three projecting sections 63, 64 and 65 forming an inverted Y shape. Among these three projecting sections 60, 61 and 62 or 63, 64 and 65, one projecting section 60 or 63 extends downward or upward from the axial center 10. Furthermore, the projecting sections 61 and 62 or 64 and 65 extend upward or downward at an angle of approximately 45 degrees from the horizontal level. In other words, in the case of FIG. 5A, the projecting sections 60, 61 and 62 are formed by the upper groove 50 and the left and right grooves 51 and 52; and in the case of FIG. 5B, the projecting sections 63, 64 and 65 are formed by the lower groove 53 and the left and right grooves 54 and 55. Accordingly, in this fifth embodiment as well, the horn main body is left-right symmetry.

In this embodiment, as in the above-described embodiments, the weight of the horn main body 3 is reduced by means of the grooves 50, 51 and 52 or 53, 54 and 55. Furthermore, rigidity and durability are maintained by the vertical projecting sections 60 or 63, and the projecting sections 61 and 62 or 64 and 65 that form a V shape or inverted V shape. Accordingly, an effect similar to that of the above-described embodiments is obtained.

Figure 6A:
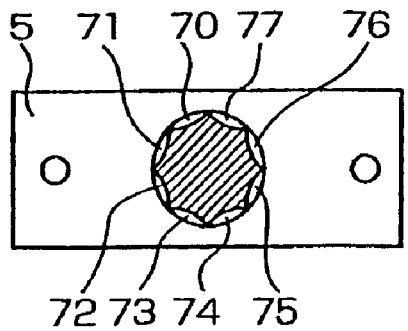
FIGS. 6A and 6B show, in cross section, the different shapes of the ultrasonic horn according to the sixth embodiment of the present invention; each one of FIGS. 6A and 6B corresponding to the cross section of FIG. 1D or 2D.
Figure 6B:
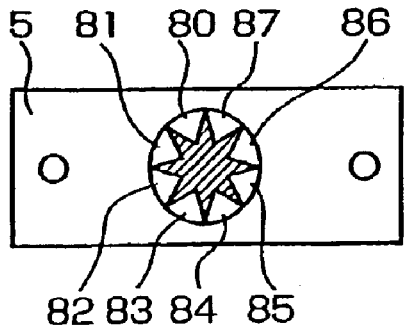

In the sixth embodiment shown in FIGS. 6A and 6B, eight circular-arc-form grooves 70 through 77 or triangular grooves 80 through 87 are formed. Accordingly, in this embodiment as well, the horn main body is left-right symmetry. Since the number of grooves is large in this embodiment, the weight is reduced, although not to the same extent as in the above-described embodiments. Furthermore, sufficient rigidity and durability are obtained.

As in the first embodiment and as seen from FIG. 1C, the grooves in the fourth through sixth embodiment are formed so as to extend from the vibration node 20 located on the capillary 2 side of the horn main body 3 to the vibration node 21 located on the flange portion 5 side. Also, as in the second embodiment and as seen from FIG. 2C, the grooves in the fourth through sixth embodiment can be formed from the vibration node 20 which is on the capillary 2 side to the vibration node 22 which is located at an intermediate point between the vibration node 20 and the vibration node 21.

In the present invention, it is most desirable that the cross-sectional shape of the horn main body where the grooves are formed is left-right and top-bottom symmetry. However, such a cross-sectional shape can be only left-right symmetry or only top-bottom symmetry. Furthermore, it is desirable from the standpoint of rigidity and durability that at least one of the projecting sections extends upward or downward from the axial center. Moreover, there are no particular restrictions on the number of grooves. However, particularly in the embodiment shown in FIGS. 6A and 6B, a larger number of grooves is less desirable from the standpoint of weight reduction; and most desirably, the number of grooves is two to six.

As seen from the above, according to the present invention, an ultrasonic horn that is used in a wire bonding apparatus and is comprised of a horn main body that has a capillary, which is at one end of the horn main body and through which a wire is passed, and a vibrator, which is provided on the horn main body, the horn main body is formed with at least two lengthwise grooves that extends along the central axis of the horn main body. Accordingly, the inertial moment and impact load can be greatly reduced, so that a substantial improvement can be made in terms of increasing of the speed of the bonding operation and facilitating of the vertical driving of the ultrasonic horn.

What is claimed is:

1. An ultrasonic horn in a wire bonding apparatus and is comprised of a horn main body that has a capillary and a vibrator, said capillary being provided at one end of said horn main body and through which a wire is passed, and said vibrator being provided on said horn main body, wherein said horn main body is provided with a flange portion for coupling said horn main body to said wire bonding apparatus and is formed with at least two grooves that extend between said flange portion and said capillary.

2. An ultrasonic horn in a wire bonding apparatus and is comprised of a horn main body that has a capillary and a vibrator, said capillary being provided at one end of said horn main body and through which a wire is passed, and said vibrator being provided on said horn main body, wherein said horn main body is formed with at least two grooves that longitudinally extends in a direction along a central axis of said horn main body and a cross-sectional shape of a portion of said horn main body in which said at least two grooves are formed is one selected from the group consisting of left-right symmetry, top-bottom symmetry, and left-right and top-bottom symmetry.

3. An ultrasonic horn used in a wire bonding apparatus and is comprised of a horn main body that has a capillary and a vibrator, said capillary being provided at one end of said horn main body and through which a wire is passed, and said vibrator being provided on said horn main body, wherein said horn main body is formed with at least two grooves that extends along a central axis of said horn main body; and a cross section of a portion of said horn main body in which said at least two grooves are formed is one selected from the group consisting to a cruciform shape, X shape, Y shape and H shape.

4. An ultrasonic horn used in a wire bonding apparatus and is comprised of a horn main body that has a capillary and a vibrator, said capillary being provided at one end of said horn main body and through which a wire is passed, and said vibrator being provided on said horn main body, wherein said horn main body is formed with at least two grooves that extends along a central axis of said horn main body; and said at least two grooves are disposed so as to extend from a point that corresponds to a vibration node of said horn main body to another point that corresponds to another vibration node of said horn main body.

* * * * *